United States Patent
Mihara

(10) Patent No.: US 6,768,688 B2
(45) Date of Patent: Jul. 27, 2004

(54) SEMICONDUCTOR MEMORY DEVICE HAVING BOOSTER CIRCUITS

(75) Inventor: Masaaki Mihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 16 days.

(21) Appl. No.: 10/191,418

(22) Filed: Jul. 10, 2002

(65) Prior Publication Data

US 2003/0151958 A1 Aug. 14, 2003

(30) Foreign Application Priority Data

Feb. 8, 2002 (JP) ........................................ 2002-032330

(51) Int. Cl.[7] .............................................. G11C 7/00
(52) U.S. Cl. .............................. 365/189.11; 365/185.18; 365/233.5
(58) Field of Search ....................... 365/189.11, 185.18, 365/233.5

(56) References Cited

U.S. PATENT DOCUMENTS 6,141,262 A * 10/2000 Sudo ..................... 365/189.09
6,147,923 A * 11/2000 Nakano ....................... 365/226

FOREIGN PATENT DOCUMENTS

JP 6-28876 2/1994
JP 7-46825 2/1995

OTHER PUBLICATIONS

Ohm–sha, Electronic Engineering Pocket Book, 3rd Edition, 1981 (w/Partial English Translation).

* cited by examiner

*Primary Examiner*—Hoai Ho
(74) *Attorney, Agent, or Firm*—McDermott Will & Emery LLP

(57) ABSTRACT

A semiconductor memory device performs a normal boost operation and increases access speed of the operation. The semiconductor memory device includes: a plurality of memory cells; a plurality of word lines to which voltages are applied to select the plurality of memory cells; a decoder that selects one of the plurality of word lines based on an address signal representing an address of one of the plurality of memory cells to be accessed; a control circuit that outputs an activated control signal and an deactivated control signal according to a transition of the address signal; and a booster that has a plurality of booster circuits including first booster circuit and second booster circuit. The first booster circuit is connected to the decoder and supplies boosted voltage to a selected word line based on the activated control signal. The second booster circuit is input the deactivated control signal.

4 Claims, 8 Drawing Sheets

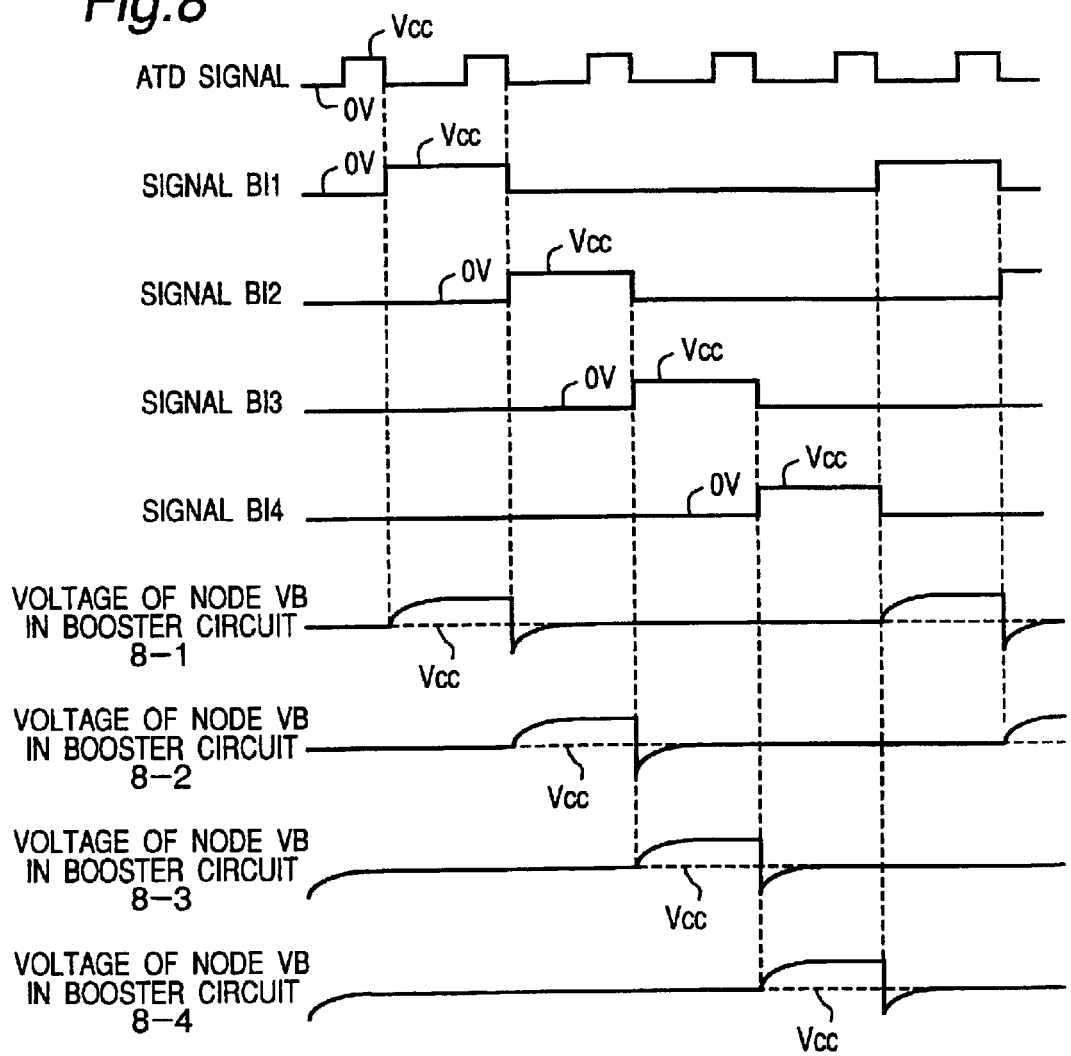

SEMICONDUCTOR MEMORY DEVICE HAVING BOOSTER CIRCUITS

BACKGROUND OF THE INVENTION

1. Field of the Invention

The present invention relates to a semiconductor memory device. More particularly, the present invention relates to boosting voltage of a word line of a semiconductor memory device.

2. Description of the Background Art

In recent years, demand for nonvolatile semiconductor memory devices increases. As such a semiconductor memory device, an electrically erasable and programmable read only memory (hereinafter referred to as EEPROM) such as a flash memory is known. In EEPROM, a plurality of potentials that are different from a potential of power supply supplied from outside of EEPROM are generated, a voltage of a word line are boosted by means of these potentials, so that EEPROM performs operations such as electrically writing, reading, erasing, and the like of data.

Japanese Laid-Open Patent Publication No. 6-28876 (Japanese Patent No. 3161052) discloses a configuration of a nonvolatile semiconductor memory device which boosts a voltage of a word line. More specifically, FIG. 1A is a conventional circuit diagram in which the voltage of a word line is boosted. FIG. 1B is a timing chart of the circuit in FIG. 1A. An operation of the circuit will be described below with reference to FIG. 1A. Whether the voltage of the word line is boosted or not, i.e., whether the word line is selected or not is determined by examining whether all internal row address signals are at high levels or not. When at least one of the internal row address signals is at low level, potential of node 89 becomes ground level. In this case, the word line is in non-selected state. On the other hand, when all the internal row address signals are at high levels, the potential of node 89 is equal to that of node 88, and the word line is in selected state.

Before the word line is selected to boost the voltage of the word line, the circuit receives from an address transition detector (ATD) circuit (not shown) a high-level ATD signal that representing that an address to be accessed is subjected to transition. As a result, an output from inverter 86 becomes low level, and charge of capacitor 87 connected to node 88 is started. This charging is performed in a period of time in which ATD signal is at high level. The operation timing is as shown in FIG. 1B. When ATD signal becomes low level, boosting the voltage of the word line is started. At this time, the voltage level of node 88 reaches Vcc which is equal to power supply voltage, and the charging has been completed. Therefore, the voltage of the word line can be boosted.

In order to increase speed of an access operation of the semiconductor memory device, the time required to charge capacitor 87 must be shortened. In other words, the period of time in which ATD signal is at high level must be shortened. However, when the period of time is shortened, the time required to charge capacitor 87 is insufficient, and a boost operation cannot be normally performed.

SUMMARY OF THE INVENTION

It is an object of the present invention to perform a normal boost operation while increasing the speed of an access operation in a semiconductor memory device.

According to an aspect of the present invention, the semiconductor memory device includes: a plurality of memory cells; a plurality of word lines to which voltages are applied to select the plurality of memory cells; a decoder that selects one of the plurality of word lines based on an address signal representing an address of one of the plurality of memory cells to be accessed; a control circuit that outputs an activated control signal and an deactivated control signal according to a transition of the address signal; and a booster that has a plurality of booster circuits including first booster circuit and second booster circuit. The first booster circuit being connected to the decoder and supplying boosted voltage to a selected word line based on the activated control signal. The second booster circuit being input the deactivated control signal.

When each of the plurality of booster circuits are controlled to be activated/deactivated, while one booster circuit is in a boost operation for a word line, the other booster circuit can perform charging. Since an apparent charging time can be shortened while sufficient charging for boosting is performed, high speed access to the memory cell can be realized. In particular, since the plurality of booster circuits are alternatively activated/deactivated, charging is normally completed every timing at which address transition occurs, and boosted voltage can be supplied to a word line.

The second booster circuit may charge, based on the deactivated control signal, an internal node of the second booster circuit up to a voltage obtained before the boosted voltage is output. According to the operation, an apparent charging time is further shortened, and high speed access to the memory cell can be realized.

The each of a plurality of booster circuits may include a plurality of capacitor elements, a first circuit that charges the plurality of capacitor elements when the control signal is deactivated; and a second circuit that outputs the boosted voltage obtained by series connection of the plurality of charged capacitor elements when the control signal is activated. In this manner, a boost operation and a charging operation can be switched to each other. According to this configuration, an apparent charging time can be shortened while sufficient charging for boosting is performed.

The semiconductor memory device may further include a detection circuit that detects the transition of the address signal to output a detection signal, the control circuit may have a counter circuit that counts transitions of the detection signal output from the detection circuit to switch the activated control signal and the deactivated control signal. According to this configuration, while one booster circuit is in a boost operation for a word line, the other booster circuit can perform charging.

BRIEF DESCRIPTION OF THE DRAWINGS

This and other objects and features of the present invention will become clear from the subsequent description of a preferred embodiment thereof made with reference to the accompanying drawings, in which like parts are designated by like reference numerals and in which:

FIG. 8 is a timing chart of various signals obtained when voltages are boosted in four booster circuits.

DETAILED DESCRIPTION OF THE PREFERRED EMBODIMENTS

An embodiment of the present invention will be described below with reference to the accompanying drawings.

As one characteristic feature of the present invention, a plurality of booster circuits each for boosting voltages of word lines are arranged, and, while one booster circuit is in a boost operation, other booster circuit(s) can perform charging. According to this operation, since an apparent charging time can be shortened while sufficient charging for boosting the word lines is performed, high speed access to a memory cell can be achieved.

Figure 2:
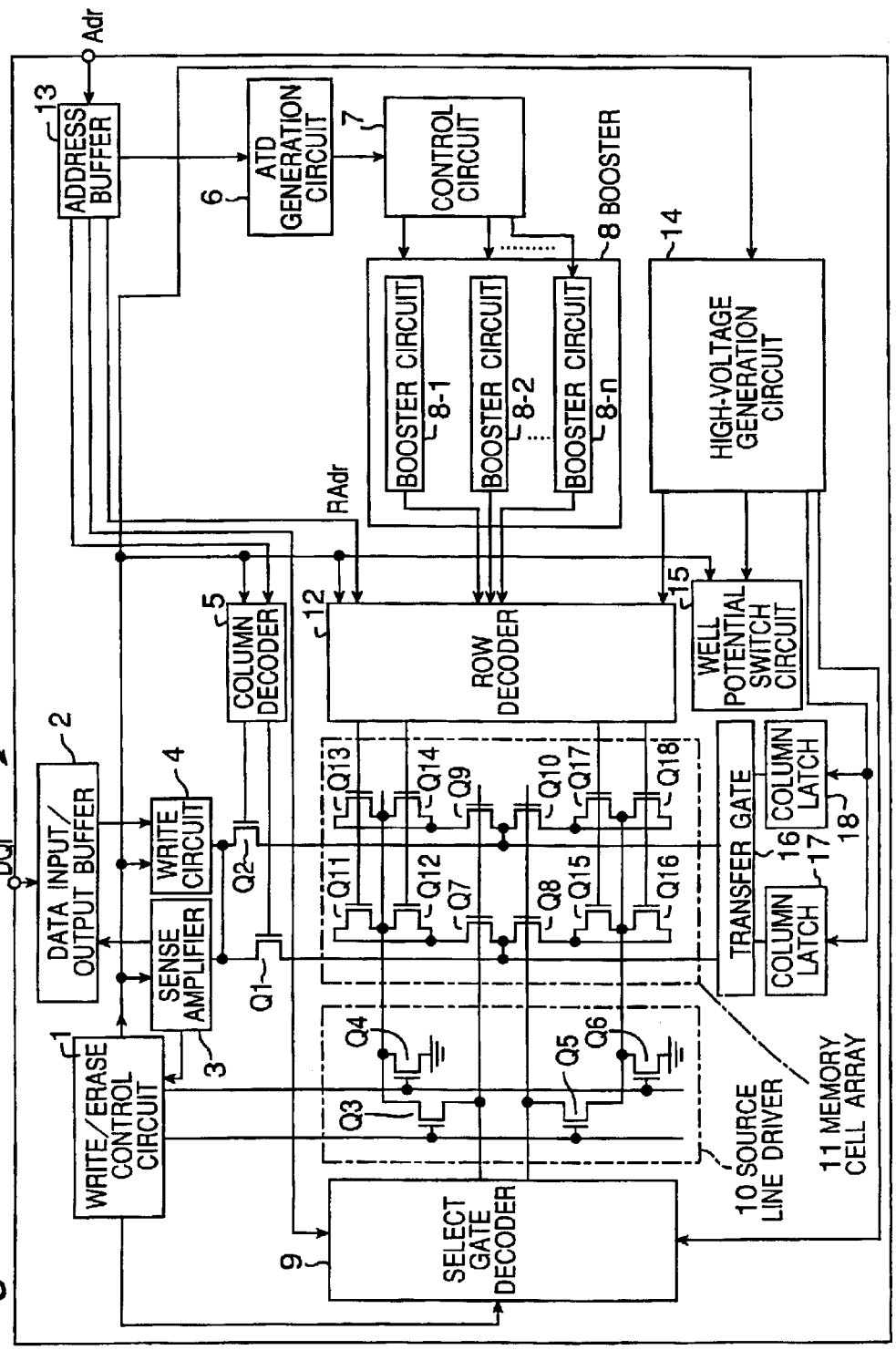
FIG. 2 is a block diagram of a semiconductor memory device according to the present invention.

FIG. 2 is a block diagram of semiconductor memory device 100 according to the present invention. Semiconductor memory device 100 is a nonvolatile type semiconductor memory device, e.g., an EEPROM such as a flash memory. Semiconductor memory device 100 internally generates potential which is different from that of power supply, boosts a voltage of a word line by using the potential, and performs operations such as electrically writing, reading, erasing, and the like of data.

The configuration of semiconductor memory device 100 will be described below. Semiconductor memory device 100 includes write/erase control circuit 1, data input/output buffer 2, sense amplifier 3, write circuit 4, column decoder 5, address transition detector (ATD) generation circuit 6, control circuit 7, booster 8, select gate decoder 9, source line driver 10, memory cell array 11, row decoder 12, address buffer 13, high-voltage generation circuit 14, well potential switching circuit 15, transfer gate 16, and column latches 17 and 18. For descriptive convenience, memory cell array 11 in one block is simplified with 2×2 memory cells.

Write/erase control circuit 1 controls timings of a write operation and an erase operation, and voltages in these operations. Data input/output buffer 2 outputs data output from sense amplifier 3 to data terminal DQr, or outputs write data input from data terminal DQr to write circuit 4. Sense amplifier 3 amplifies data of the memory cells in memory cell array 11 input through Y-gate transistors Q1 and Q2, and outputs the data to data input/output buffer 2. Write circuit 4 provides data input from data input/output buffer 2 with column latches 17 and 18. Column decoder 5 receives an output from address buffer 13 to select Y-gate transistor Q1 or Q2. Select gate decoder 9 receives an output from address buffer 13 to select one of select gates Q7 to Q10 in memory cell array 11. Source line driver 10 includes N-channel MOS transistors Q3 to Q6. Source line driver 10 applies to a source line of the memory cell a voltage at ground level in a read operation and a negative voltage in an erase operation.

Memory cell array 11 includes memory cells Q11 to Q18 and a plurality of select gates Q7 to Q10. In memory cell array 11, data is written or erased in a memory cell selected by row decoder 12 and column decoder 5. Row decoder 12 receives an output from address buffer 13 to select a predetermined word line from the plurality of word lines. Address buffer 13 receives an address signal from an address terminal Adr. The address signal is used to select a specific memory cell in memory cell array 11. Address buffer 13 further outputs a column address signal to column decoder 5, and outputs a row address signal RAdr to row decoder 12.

High-voltage generation circuit 14 generates a positive or negative high voltage required in writing or reading data based on a control signal from write/erase control circuit 1. High-voltage generation circuit 14 functions as a selector. More specifically, high-voltage generation circuit 14 selects an object component to which high-voltage generation circuit 14 applies a voltage. High-voltage generation circuit 14 generates and outputs high voltage to any one of select gate decoder 9, row decoder 12, well potential switch circuit 15, and column latches 17 and 18 according to operation modes of semiconductor memory device 100. Well potential switch circuit 15 applies a negative high voltage to P well when erasing data in the memory cell, and applies a ground voltage to P well in other operation mode(s). Transfer gate 16 controls connections between column latches 17, 18 and bit lines. Column latches 17 and 18 latch write operations.

ATD circuit 6 detects transition of an address signal input from the address terminal Adr to address buffer 13, and outputs an ATD signal. The "transition" means a change of an address of memory cell to be accessed. The ATD signal becomes high level in a predetermined period of time depending on a transition of the address signal. Control circuit 7 outputs a control signal based on ATD signal from ATD generation circuit 6. The control signal is sent to each of booster circuits constituting booster 8 (to be described later), is used to control the operation timings of the booster circuits, and is also called as a booster circuit activating signal. Booster 8 includes a plurality of booster circuits 8-1, . . . , 8-n (n: integer). Each of the booster circuits boosts a power supply voltage and applies the boosted voltage to a word line selected by row decoder 12 in data read operation.

Figure 3:
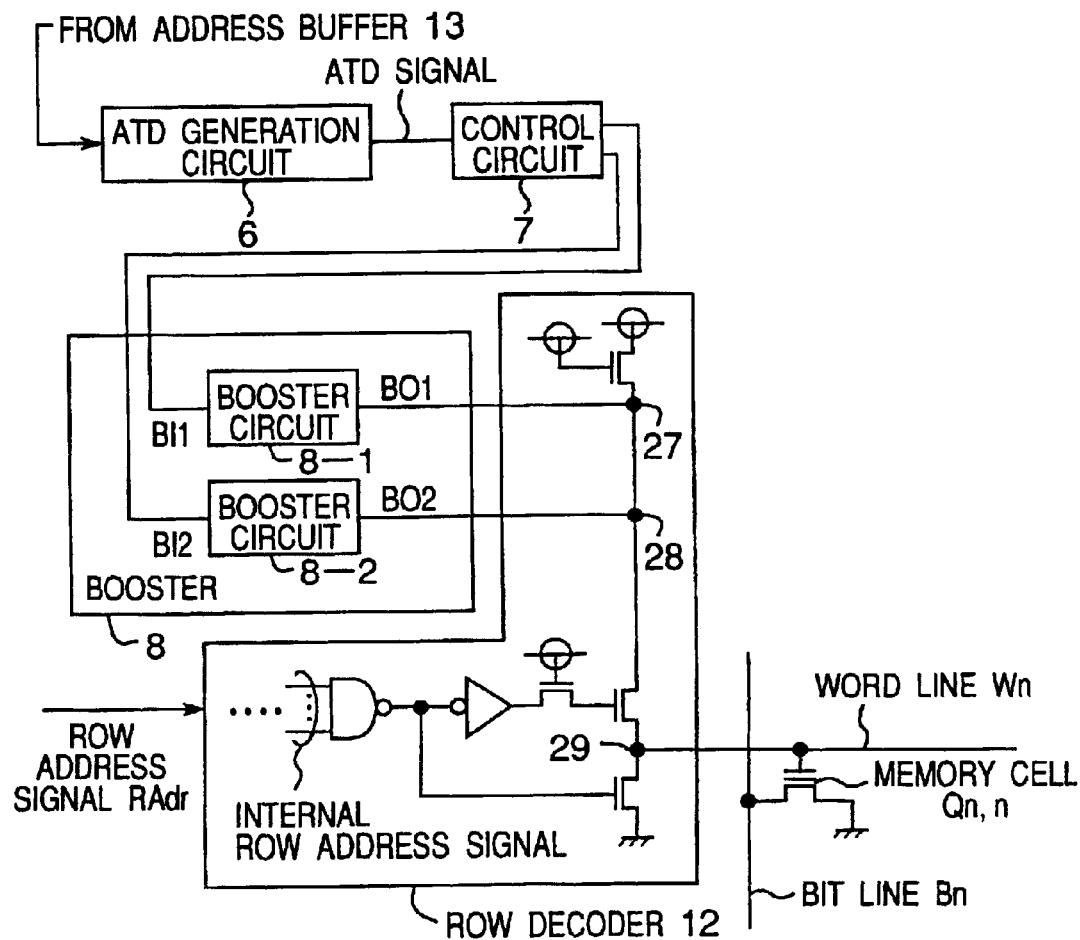
FIG. 3 is an exeplary circuit diagram of a row decoder.

Relationships of booster 8, row decoder 12, and the memory cells in the memory cell array 11 will be described below in more detail. FIG. 3 is an exemplary circuit diagram of row decoder 12. In this diagram, it is assumed that booster 8 has two booster circuits 8-1 and 8-2. As described above, ATD generation circuit 6 generates the ATD signal in response to address transition in address buffer 13 and sends the ATD signal to control circuit 7. Control circuit 7 outputs booster circuit activating signals BI1 and BI2. Booster circuits 8-1 and 8-2 receive activating signals BI1 and BI2 from control circuit 7, respectively. Booster circuits 8-1 and 8-2 start boost operations at times based on activating signals BI1 and BI2, or output boosted voltages. Outputs BO1 and BO2 of booster circuits 8-1 and 8-2 are connected to row decoder 12 in common.

Figure 1A:
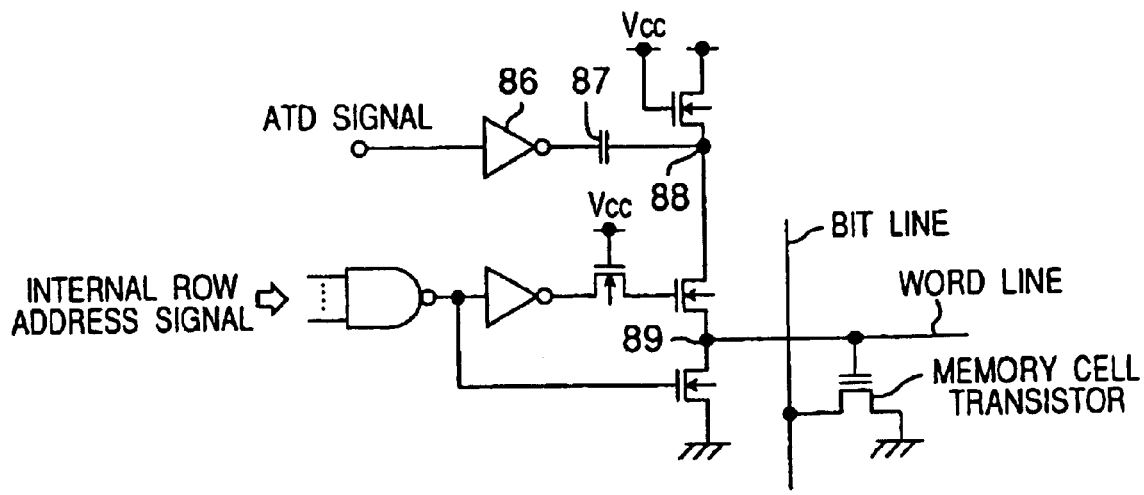
FIG. 1A is a conventional circuit for boosting a word line.
Figure 1B:
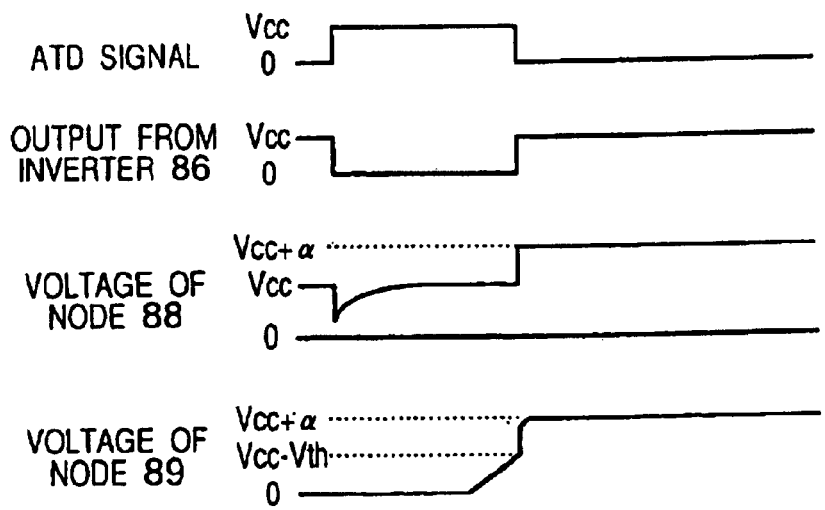
FIG. 1B is a timing chart of the circuit in FIG. 1A.

The row decoder 12 applies the boosted voltage from one of the booster circuits 8-1 and 8-2 of the booster 8 to a word line selected based on the row address signal RAdr. As far as the function is realized, the configuration of the row decoder 12 is arbitrarily determined. For example, the row decoder 12 in FIG. 3 may have a similar configuration to the conventional row decoder of FIG. 1A. More specifically, row decoder 12 receives the row address signal RAdr and converts the row address signal RAdr into a plurality of internal row address signals which are all at high levels to output the plurality of internal row address signals. Since the converting operation and a configuration therefor are known by one skilled in the art, a description thereof will be omitted.

On a word line Wn connected to memory cells Qn, n which are not accessed, at least one of the internal row address signals becomes low level. As a result, node 29 becomes the ground potential, and the word line Wn becomes the ground potential, that is, non-selected state, thereby, the memory cell transistor Q is kept OFF state.

On the other hand, on a word line connected to memory cells Qn, n which are accessed, all the internal row address signals become high levels, and the node 29 is electrically connected to connection nodes 27 and 28 between the booster circuits 8-1 and 8-2 and the row decoder 12. Therefore, the word line Wn is electrically connected to the booster 8 (selected state). As a result, a boosted voltage from the booster circuit 8-1 or the booster circuit 8-2 is applied to the word line Wn, and the memory cell transistors Qn, n are turned on. The memory cells Qn, n can be accessed by using a bit line Bn.

Figure 4A:
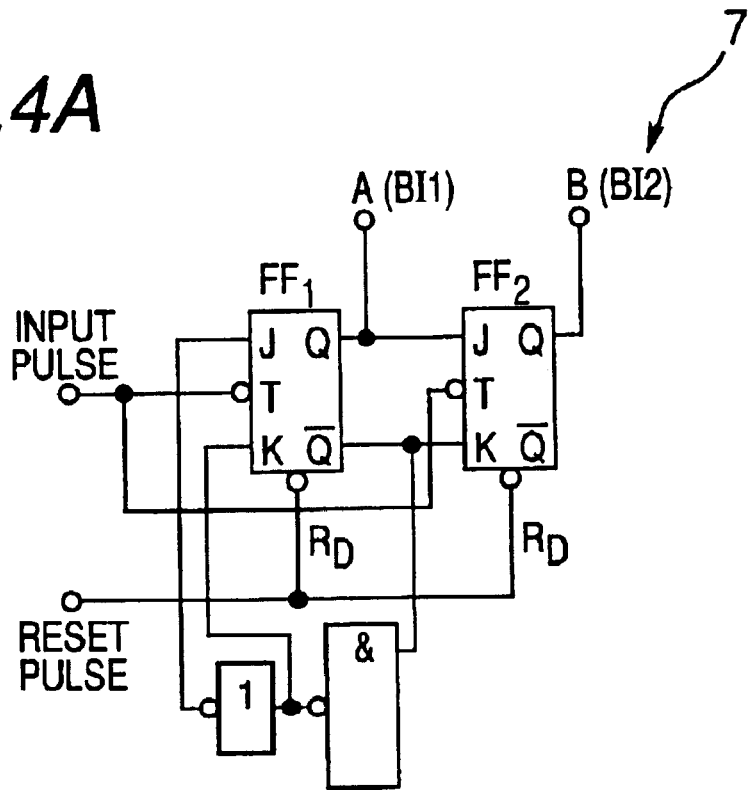
FIG. 4A is a circuit diagram of a control circuit.
Figure 4B:
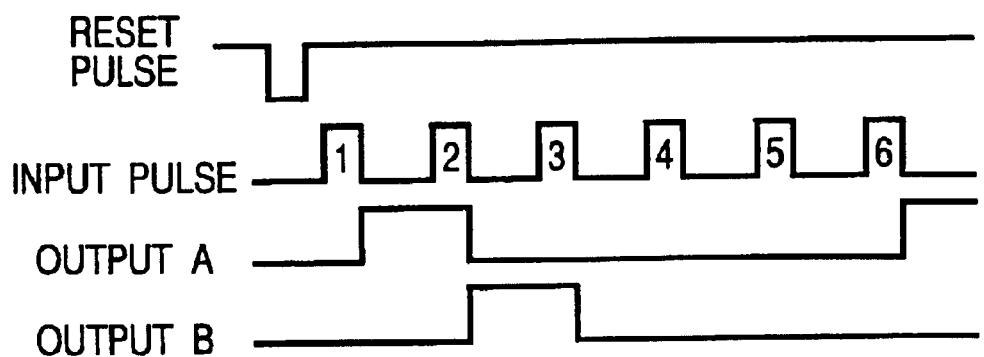
FIG. 4B is a timing chart of an operation timing of the control circuit.

The configurations and operations of control circuit 7 and booster circuit 8-n will be described below. FIG. 4A is a circuit diagram which shows a configuration of control circuit 7. FIG. 4B is a timing chart which shows an operation timing of control circuit 7. The configuration shown in FIG. 4A is a so-called ring counter. As shown in FIG. 4A, control circuit 7 includes two JK flipflops FF1 and FF2 and two output terminals A and B corresponding to outputs Qs from the respective flipflops. Two activating signals BI1 and BI2 are output from output terminals A and B.

The JK flipflop is reset by reset pulse RD and accepts states of inputs J and K based on a timing of an input pulse to output a signal. According to the present invention, the input pulse corresponds to an ATD signal output from ATD generation circuit 6 (FIG. 3). In the illustrated control circuit 7, the flipflops are reset by the reset pulse RD, and JK flipflop FF1 receives high- and low-level signals on the input terminals J and K in response to an input pulse 1. As a result, flipflop FF1 outputs 1 and 0 from output terminals Q and Q⁻. The output signals are shifted to JK flipflop FF2 of the nest stage. More specifically, flipflop FF2 receives high- and low-level signals output from flipflop FF1 on input terminals J and K, respectively, based on next input pulse 2. As is apparent from FIG. 4B, after the reset pulse is input, one of the outputs A and B from flipflops FF is always at high level. The high-level signal is shifted, and sequentially output from terminals A and B.

Figure 5:
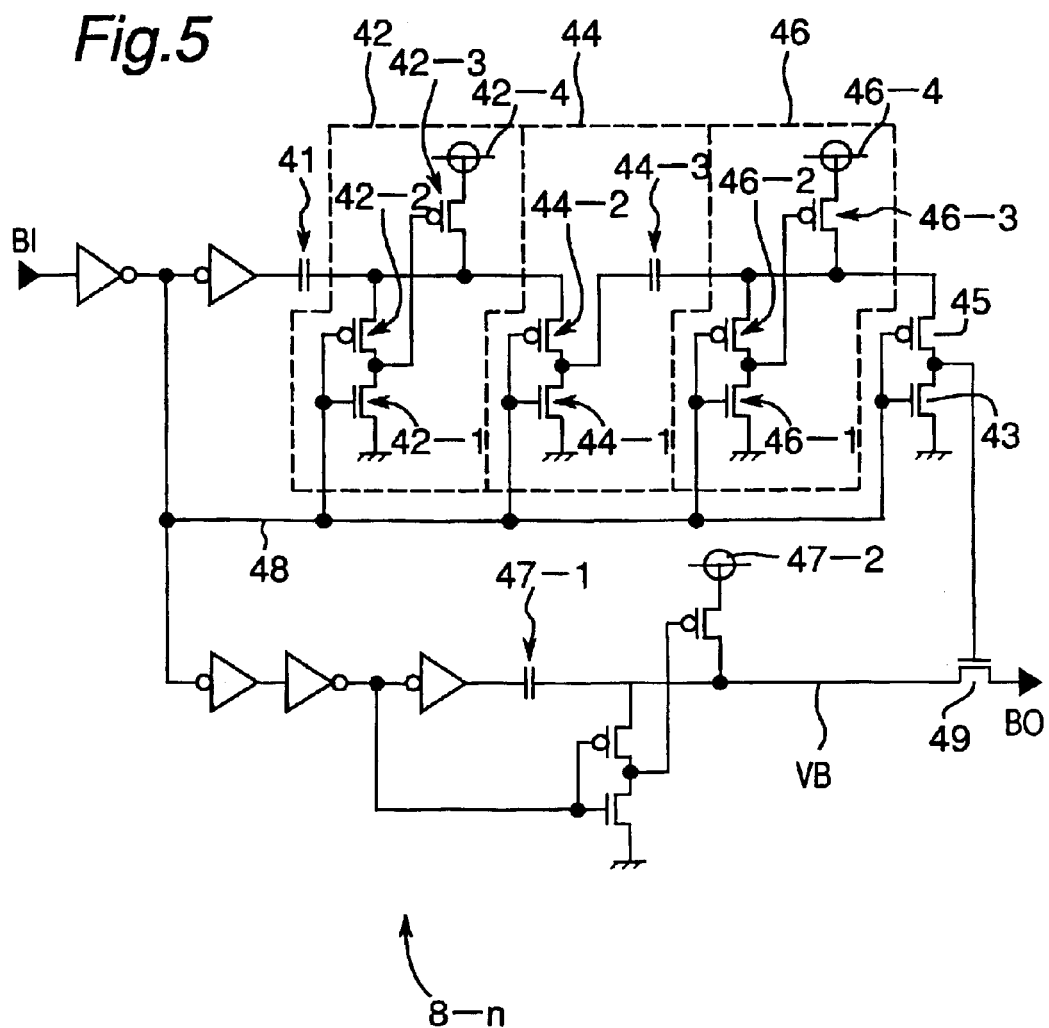
FIG. 5 is a circuit diagram of a booster circuit.

Subsequently, booster circuit 8-n (n: integer) will be described below. For example, it is assumed that booster circuit 8-n as shown in FIG. 5 is used. As a matter of course, the present invention can also be performed by another configuration.

FIG. 5 is a circuit diagram of booster circuit 8-n (n: integer). Booster circuit 8-n outputs boosted voltage BO based on next input BI. Booster circuits 8-n includes capacitor elements 41, 44-3, and 47-1 which are used for charge pumping, connection switch circuits 42 and 46 that switch whether capacitor element 41 and 44-3 are connected in series with each other or not, and charging switch circuit 44 that charges capacitor elements 41 and 44-3. Booster circuit 8-n includes power supply 47-2 that charges the capacitor elements, and transistor 49 for switching whether the voltage of a line VB as boosted voltage BO. The configurations of connection switch circuits 42 and 46 are equal to each other. Capacitor element 41, connection switch circuit 42, charging switch circuit 44, and connection switch circuit 46 are connected in series with each other in the order named. Inverted signal 48 of input signal BI is input to circuits 42, 44, and 46. Circuits 42, 44, and 46 adjust a voltage applied to the gate of transistor 49 depending on whether inverted signal 48 is in high level or in low level. The details of the adjustment will be described below.

It is considered that inverted signal 48 becomes high level by low-level input signal BI. In this case, in connection switch circuit 42, transistor 42-1 is turned on, and transistor 42-3 is also turned on. Since the potential of capacitor element 41 on input BI side is at low level, power supply 42-4 starts electrifying capacitor element 41. Note that transistor 42-2 is in an off state. In charging switch circuit 44, transistor 44-1 is turned on, both electrodes of capacitor element 43 has the ground potential. In connection switch circuit 46, when transistors 46-1 and 46-3 are turned on, power supply 46-4 starts charging capacitor element 44-3. Since inverted signal 48 is at high level, transistor 43 is turned on, and the gate of transistor 49 has the ground potential. Therefore, when input signal BI is at low level, charging capacitor elements 41 and 44-3 is started. At this time, it is noted that charge pump capacitor element 47-1 is also charged by power supply 47-2.

It is considered that inverted signal 48 becomes low level by high-level input signal BI. In this case, in connection switch circuit 42, transistor 42-2 is turned on, and transistor 42-1 and transistor 42-3 are turned off. In charging switch circuit 44, transistor 44-2 is turned on. As a result, capacitor elements 41 and 44-3 are connected in series with each other. More specifically, charging switch circuit 44 switches whether capacitor element 41 and capacitor element 44-3 are connected in series with each other or not by an on/off operation of transistor 44-2 based on inverted signal 48. In the connection switch circuit 46, transistor 46-2 is turned on, while transistor 46-3 is turned off. Therefore, input signal BI is at high level, capacitor elements 41 and 44-3 are connected in series with each other. Furthermore, at this time, since inverted signal 48 is at low level, transistor 45 is set in an ON state. Therefore, sufficiently larger voltage than a threshold voltage is obtained by the series connection of capacitor elements 41 and 44-3 and is applied to the gate of transistor 49. As a result, transistor 49 is turned on, a boosted voltage which is not decreased due to the threshold voltage is output by charge pump capacitor element 47-1.

Figure 6:
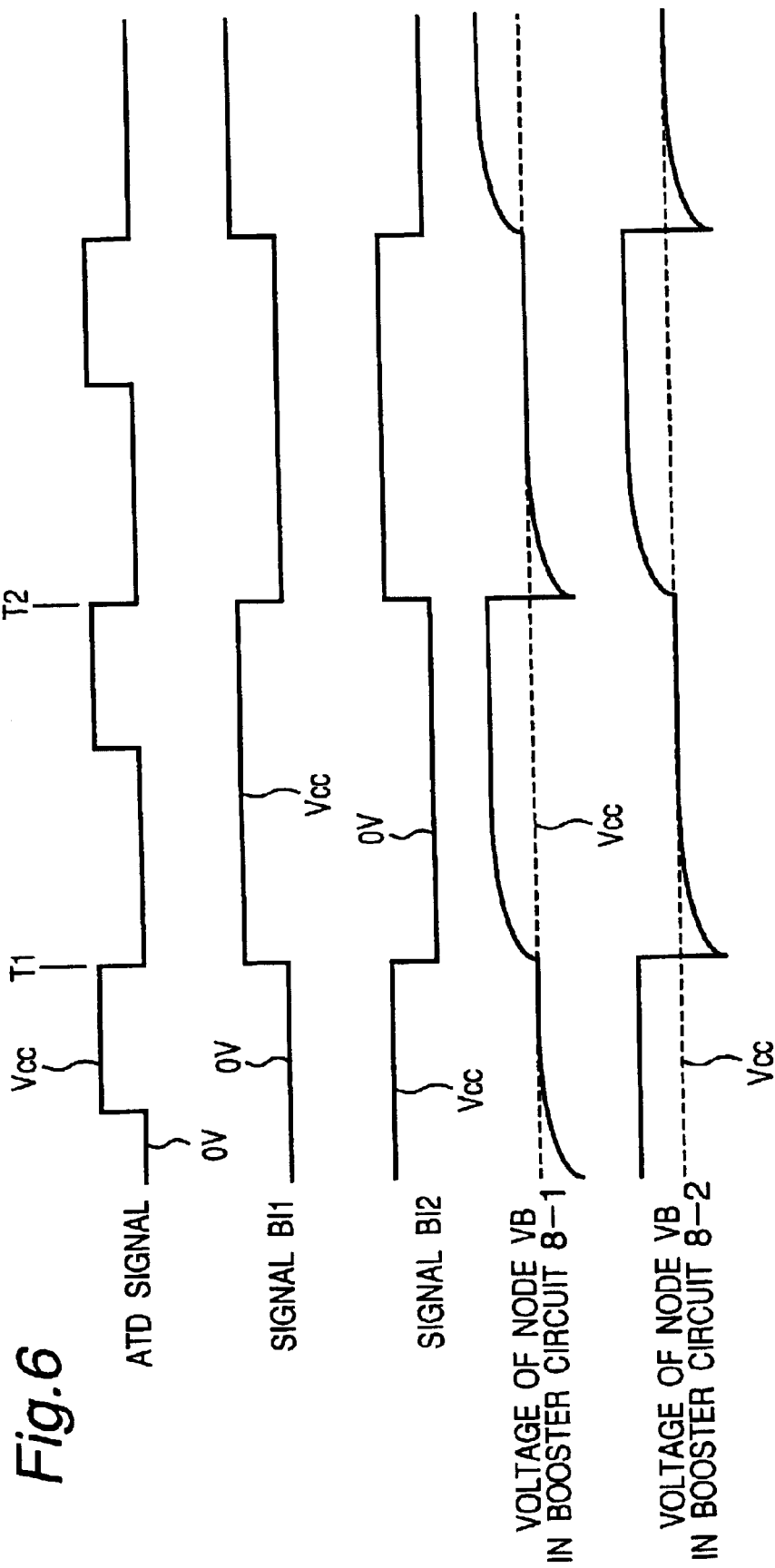
FIG. 6 is a timing chart of various signals when voltages are boosted in two booster circuits.

The operations of ATD generation circuit 6, control circuit 7, and booster circuits 8-1 and 8-2 of booster 8 based on the configurations described with reference to FIGS. 3 to 5 will be described below. FIG. 6 is a timing chart of various signals obtained when voltages are boosted in the two booster circuits. Signals BI1 and BI2 are shown in FIG. 3, and a node VB in the booster circuits 8-1 and 8-2 is shown in FIG. 5. Control circuit 7 (FIG. 3) receives an ATD signal from ATD generation circuit 6, and inverts activating signals BI1 and BI2 at a trailing edge of the ATD signal. In FIG. 3, the trailing edge of the ATD signal appears at times T1 and T2. At time T1, the control circuit makes the level of signal BI1 high, and activates booster circuit 8-1 (FIG. 5). High-level control signal output from the control circuit is also called as an activating signal. An operation performed at this time is as described with reference to FIG. 5. As a result, the voltage of the node VB of booster circuit 8-1 (FIG. 5) is boosted. As is apparent from FIG. 6, the voltage of the node VB is boosted to be higher than a power supply voltage Vcc. The boosted voltage is applied to a selected word line.

When an address to be accessed is changed to select a word line that is different from the word line selected at the present, ATD generation circuit 6 (FIG. 3) generates a new ATD signal and sends the ATD signal to control circuit 7 (FIG. 3). Control circuit 7 (FIG. 3) makes the level of signal BI2 high at the trailing edge of the ATD signal at time T2, and activates booster circuit 8-2 (FIG. 3). The voltage boosted by booster circuit 8-2 (FIG. 3) is applied to a newly selected word line. At this time, the level of signal BI1 is set to low, and booster circuit 8-1 (FIG. 5) which has been activated is deactivated. Thereafter, inactive booster circuit 8-1 (FIG. 5) performs a charging operation. More specifically, the voltage of the node VB of booster circuit 8-1 (FIG. 5) is smaller than the power supply voltage Vcc:

Therefore, the node VB is charged to have a voltage equal to the power supply voltage Vcc. As a result, booster 8 (FIG. 3) including booster circuits 8-1 and 8-2 can output sufficiently boosted voltages every transition of the ATD signal.

As described above, since the plurality of booster circuits are alternately activated/deactivated, sufficient times for charging the capacitors in each booster circuit can be secured. The charging is apparently normally completed every timing at which address transition occurs, and a boosted voltage can be supplied to a word line. For this reason, high speed access to a memory cell can be realized.

Figure 7:
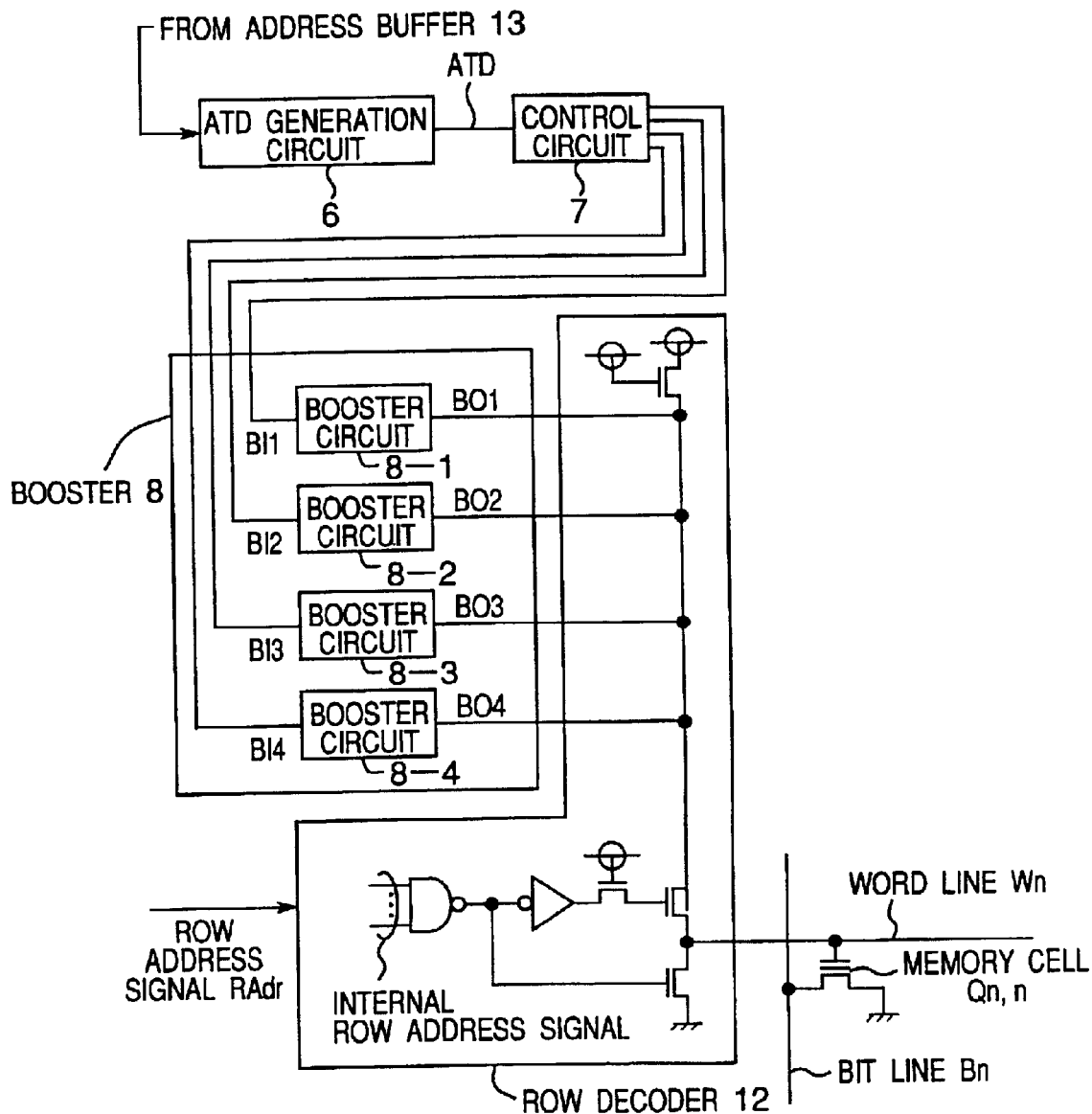
FIG. 7 is a block diagram of a booster having four booster circuits.

In FIG. 3, although it is described that booster 8 includes two booster circuits, the number of booster circuits can be larger. FIG. 7 is a block diagram that shows a configuration in which booster 8 has four booster circuits 8-1 to 8-4. The configuration in FIG. 7 is different from that in FIG. 3 in that the four booster circuits are arranged. Due to such difference, in FIG. 7, the control circuit 7 generates control signals BI1 to BI4, and row decoder 12 receives output from the four booster circuits. Since the configuration in FIG. 7 is equal to that in FIG. 3 except for the above points, a description of equivalent elements will be omitted. FIG. 8 shows a timing chart of various signals obtained when voltages are boosted in the four booster circuits. As described with reference to FIG. 6, control circuit 7 (FIG. 7) outputs signals BI1 to BI4, the high levels of which are sequentially shifted depending on the trailing edge of an ATD signal. Booster circuits 8-1 to 84 output boosted voltages when the corresponding signals BI1 to BI4 become high levels. On the other hand, respective booster circuits 8-1 to 8-4 start charging internal capacitors when the corresponding signals BI1 to BI4 become low levels. In this manner, when a large number of booster circuits are sequentially activated, times required for charging the capacitors can be further shortened. Therefore, very high speed access to a memory cell can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
   a plurality of memory cells;
   a plurality of word lines to which voltages are applied to select the plurality of memory cells;
   a decoder for selecting one of the plurality of word lines based on an address signal representing an address of one of the plurality of memory cells to be accessed;
   a control circuit for outputting an activated control signal and an deactivated control signal according to a transition of the address signal; and
   a booster that has a plurality of booster circuits including first booster circuit and second booster circuit, said first and second booster circuits being connected to the decoder, performing a charging operation and supplying boosted voltage to a selected word line, wherein
   said first and second booster circuits are configured to perform the charging operation when receiving the deactivated control signal from the control circuit, and supply the boosted voltage to the selected word line when receiving the activated control signal from the control circuit, and
   the control circuit is configured to output the activated control signal and the deactivated control signal to said first and second booster circuits so that one of said first and second booster circuits performs the charging operation, while the other supplies the boosted voltage to the selected word line.

2. A semiconductor memory device according to claim 1, wherein the second booster circuit charges, based on the deactivated control signal, an internal node of the second booster circuit up to a voltage obtained before the boosted voltage is output.

3. A semiconductor memory device according to claim 2, wherein
   each of the plurality of booster circuits comprises:
      a plurality of capacitor elements;
      a first circuit configured for charging the plurality of capacitor elements when the control signal is deactivated; and
      a second circuit configured for outputting the boosted voltage obtained by series connection of the plurality of charged capacitor elements when the control signal is activated.

4. A semiconductor memory device according to claim 3, further comprising a detection circuit that detects the transition of the address signal to output a detection signal, wherein the control circuit has a counter circuit that counts transitions of the detection signal output from the detection circuit to switch the activated control signal and the deactivated control signal.

* * * * *